(12) United States Patent
Hayase et al.

(10) Patent No.: US 6,335,657 B1
(45) Date of Patent: Jan. 1, 2002

(54) MOSFET AMPLIFIER CIRCUIT

(75) Inventors: Hiromichi Hayase; Kotaro Takenaga; Takeshi Ishigami, all of Tokyo (JP)

(73) Assignee: Kokusai Electric Co. Ltd., Tokyo (JP)

( * ) Notice: Subject to any disclaimer, the term of this patent is extended or adjusted under 35 U.S.C. 154(b) by 0 days.

(21) Appl. No.: 09/643,957

(22) Filed: Aug. 23, 2000

(30) Foreign Application Priority Data

Aug. 27, 1999 (JP) .......................................... 11-241133

(51) Int. Cl.[7] .............................. G06G 7/12; G06G 7/26
(52) U.S. Cl. ..................... 327/560; 327/562; 327/427; 327/541; 327/543; 330/277; 330/296
(58) Field of Search ................................. 327/560–563, 327/427, 538, 540, 541, 543; 330/277, 296

(56) References Cited

U.S. PATENT DOCUMENTS

| | | | | |
|---|---|---|---|---|
| 4,051,392 A | * | 9/1977 | Rosenthal et al. | 327/541 |
| 4,340,867 A | * | 7/1982 | Sano | 330/296 |
| 5,235,218 A | * | 8/1993 | Matsuo et al. | 327/538 |
| 5,373,226 A | * | 12/1994 | Kimura | 327/541 |
| 5,796,278 A | * | 8/1998 | Osborn et al. | 327/427 |
| 5,920,232 A | * | 7/1999 | Hariton | 330/303 |
| 5,977,832 A | * | 11/1999 | Satyanarayana et al. | 330/296 |

\* cited by examiner

Primary Examiner—Terry D. Cunningham
Assistant Examiner—Long Nguyen
(74) Attorney, Agent, or Firm—McGinn & Gibb, PLLC

(57) ABSTRACT

A metal-oxide semiconductor field-effect transistor (MOSFET) amplifier circuit includes a compensation circuit with a low cost MOSFET and a constant current circuit providing a constant drain current of the MOSFET, which maintains an operational point of the amplifier at an optimal state at all times. The MOSFET amplifier circuit includes a first MOSFET, a constant current circuit including a variable resistor, an operational amplifier, a power supply and a resistor, a second MOSFET having a constant current generated by the constant current circuit as a drain current thereof, and a voltage control circuit including operational amplifiers and resistors for applying a gate source voltage of the second MOSFET to the first MOSFET as a gate-source voltage thereof.

10 Claims, 4 Drawing Sheets

$V_{GS}-I_{DQ}$ CHARACTERISTIC OF MOSFET

EXAMPLE OF SECULAR CHANGE OF $I_{DQ}$ OF MOSFET
(WITH CONSTANT $V_{GS}$)

EXAMPLE OF SECULAR CHANGE OF $V_{GS}$ OF MOSFET
(WITH CONSTANT $I_{DQ}$)

MOSFET AMPLIFIER CIRCUIT

BACKGROUND OF THE INVENTION

1. Field of the Invention

The present invention relates to an amplifier circuit employing MOSFETs, and in particular, to a circuit for use with a high frequency amplifier circuit employing a MOSFET for compensating for a secular change in a drain current of a MOSFET.

2. Description of the Related Art

A drain current $I_{DQ}$ of a MOSFET at the time of no signal input thereto is determined by the magnitude of a gate-source voltage $V_{GS}$ thereof. FIG. 4 shows a $V_{GS}$ versus $I_{DQ}$ characteristic of such a MOSFET. In general, the electric characteristics such as an operational point of a MOSFET vary depending upon the magnitude of a drain current thereof, so with an amplifier employing a MOSFET, the drain current $I_{DQ}$ of the MOSFET is set so as to provide an optimal electrical operational point.

However, a MOSFET has a so-called "hot carrier" phenomenon that its drain current $I_{DQ}$ changes over time. FIG. 5 illustrates an example of such a secular change in the drain current of a MOSFET with a constant gate-source voltage $V_{GS}$ thereof. As clearly seen from FIG. 5, as the drain current $I_{DQ}$ of the MOSFET changes, the electrical operational point of the MOSFET varies, thus posing a problem that the characteristics of the amplifier having an optimal electrical operational point at the time of the manufacture thereof change over time.

SUMMARY OF THE INVENTION

In view of this, the present invention is intended to obviate the above-mentioned problem of the prior art of a change in the operation point of an amplifier due to a change in a drain current of a MOSFET at the time of no signal input, and has its object to provide a MOSFET amplifier circuit which includes a compensation circuit comprising an inexpensive MOSFET and a constant current circuit for making the drain current of the MOSFET constant to thereby maintain the operational point of the amplifier at an optimal state at all the times.

Bearing the above object in mind, according to the present invention, there is provided a MOSFET amplifier circuit comprising: a first MOSFET; a constant current circuit for generating a current of a constant magnitude; a second MOSFET having a constant drain current controlled by said constant current circuit; and a voltage control circuit for applying a gate-source voltage of said second MOSFET to a gate-source voltage of said first MOSFET.

With the above arrangement, the voltage control circuit detects, for example, a gate-source voltage of the second MOSFET, amplifies and supplies it to the first MOSFET as a gate-source voltage thereof, whereby a voltage based on a secular change in the gate-source voltage of the second MOSFET, which provides a constant drain current for the second MOSFET, is given to the first MOSFET as its gate-source voltage, thus reducing a change in the drain current of the first MOSFET or making it at a constant value.

In this regard, it is to be noted that the voltage control circuit has a voltage amplification factor set in such a manner that the detected gate-source voltage of the second MOSFET is amplified in accordance with a difference in magnitude between the secular changes in the first and second MOSFETs, and supplied to the first MOSFET as its gate-source voltage. As a result, according to this invention, employing an inexpensive MOSFET for the second MOSFET, a MOSFET amplifier circuit capable of compensating for the drain current of the first MOSFET can be provided at a low cost.

In a preferred embodiment of the invention, the voltage control circuit comprises operational amplifiers and a plurality of resistors, and the constant current circuit comprises an operational amplifier, a variable resistor, resistors and a power supply.

Preferably, the second MOSFET is formed in a chip into which the first MOSFET is built.

With this arrangement, the secular change characteristics of the first and second MOSFETs can be made substantially the same, thus rendering circuit design easy and simple.

The above and other objects, features and advantages of the present invention will become apparent to those skilled in the art from the following detailed description of preferred embodiments of the invention taken in conjunction with the accompanying drawings.

DESCRIPTION OF THE PREFERRED EMBODIMENTS

Before describing details of embodiments of the present invention, reference will be made to a general concept of the present invention while referring to FIG. 1.

Figure 1:
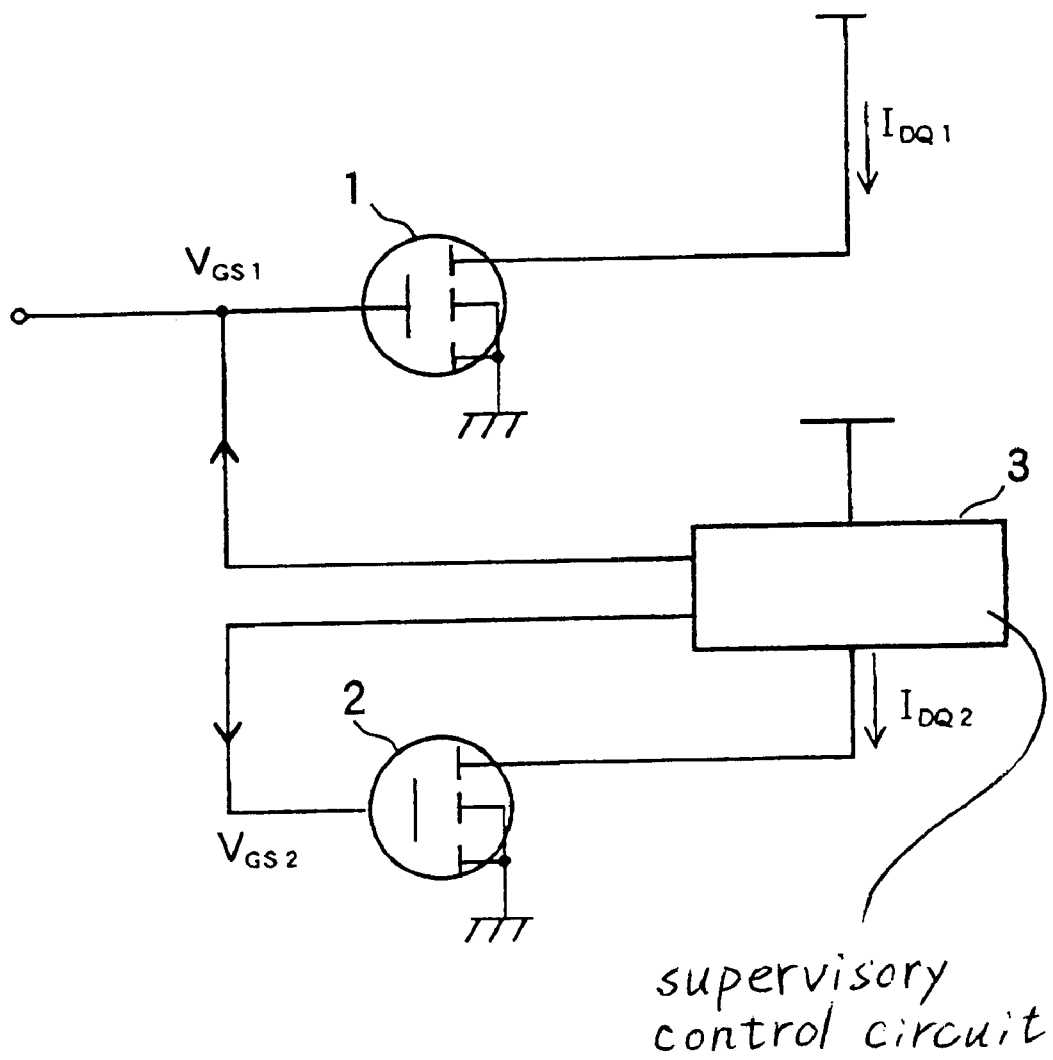
FIG. 1 is a circuit diagram conceptually showing a MOSFET amplifier circuit according to the present invention.

FIG. 1 is a circuit diagram conceptually showing the construction of the present invention. In FIG. 1, a MOSFET amplifier circuit constructed according to the principles of the present invention includes a first MOSFET in the form of an amplification MOSFET 1, a second MOSFET in the form of a drain current amplification MOSFET, and a supervisory control circuit 3. The supervisory control circuit 3 includes a constant current circuit and a voltage control circuit of the invention, and operates to supervise or monitor a drain current $I_{DG2}$ of the second MOSFET 2 and applies a gate-source voltage $V_{GS}$ to the MOSFET 2 as its gate-source voltage so as to control the drain current $I_{DG2}$ to a predetermined value.

Figure 4:
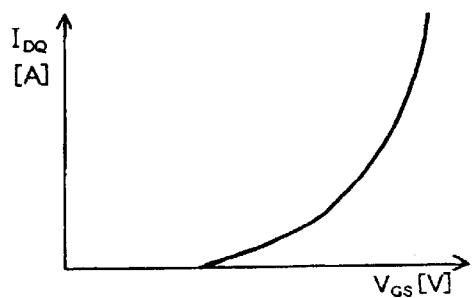
FIG. 4 is a view illustrating the relationship between a gate to source voltage of a MOSFET and a drain current thereof.
Figure 5:
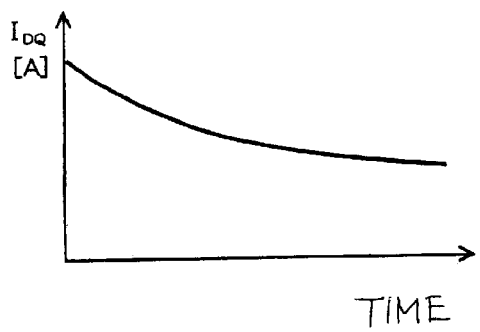
FIG. 5 is a view showing an example of a secular change in the drain current of the MOSFET.
Figure 6:
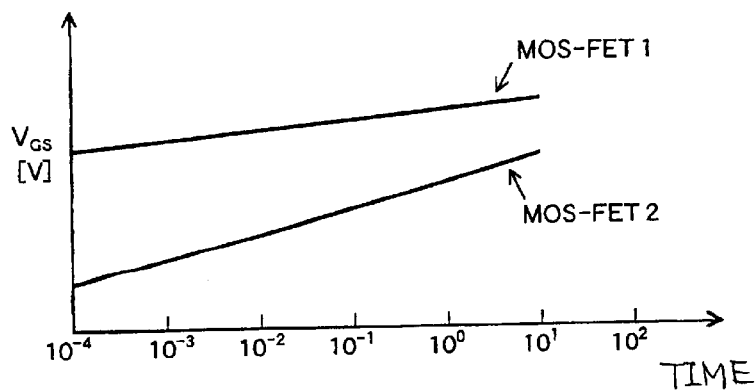
FIG. 6 is a view showing an example of a secular change in a gate to source voltage of the MOSFET.

FIG. 6 illustrates an example of a secular change in the gate-source voltage $V_{GS}$ of the MOSFET 2 when the drain current $I_{DG}$ of the MOSFET is held constant, as shown in FIGS. 4 and 5. In FIG. 6, the abscissa is indicated at a logarithmic scale. When the MOSFET 2 having undergone a secular change is controlled by the supervisory control circuit 3 such that the drain current thereof is held constant, the gate-source voltage $V_{GS}$ of the MOSFET 2 changes as shown in FIG. 6. It is desired that the MOSFET 2 is subjected to the same secular change as the MOSFET 1 undergoes, and an increasing demand for high power amplifiers in recent years results in an increased supply of MOSFETs having high power outputs and enlarged size.

For these reasons, if the same ones are employed for the first and second MOSFETs 1, 2, the construction and power consumption of the circuitry as a whole will be enlarged or increased. Thus, according to the present invention, a small-sized and inexpensive MOSFET is employed for the second MOSFET 2, and the initial value and the rate of change of the gate-source voltage $V_{GC2}$ of the second MOSFET 2 is corrected or adjusted by the supervisory control circuit 3 so that the drain current of the MOSFET 1 is made constant. The second MOSFET 2 may be achieved by the use of a part of a MOSFET built in a chip of the first MOSFET 1 while utilizing substantially the same characteristics thereof.

Now, preferred embodiments of the present invention will be described in detail while referring to the accompanying drawings.

Embodiment 1

Figure 2:
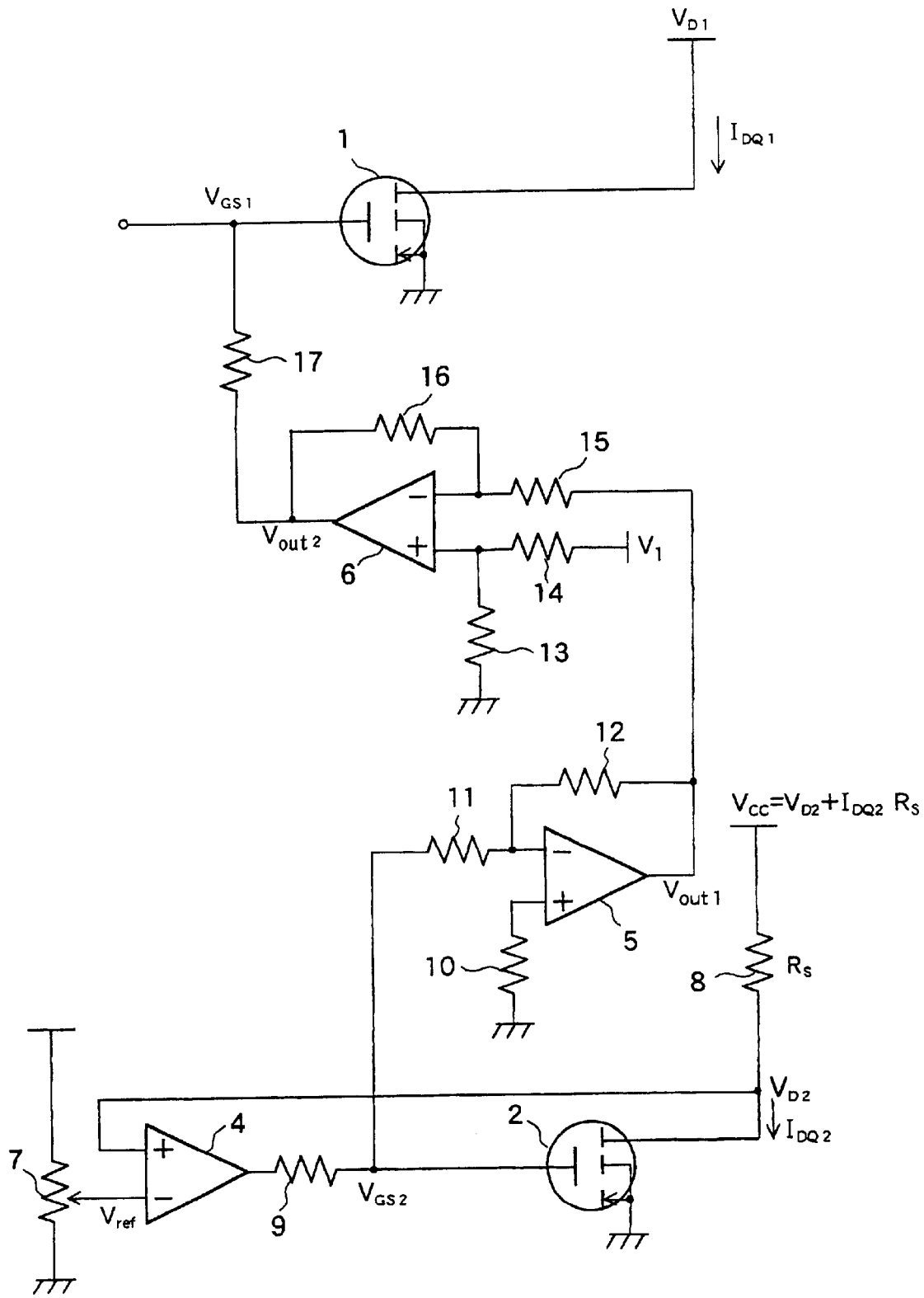
FIG. 2 is a circuit diagram showing a first embodiment of the present invention.

FIG. 2 illustrates a circuit arrangement of a MOSFET amplifier circuit according to a first embodiment of the present invention. In FIG. 2, the MOSFET amplifier circuit of this embodiment includes, in addition to a first MOSFET 1 and a second MOSFET 2 which are the same as those shown in FIG. 1, a plurality of operational amplifiers 4, 5 and 6, a variable resistor 7, and a plurality of resistors 8 through 17. In the first embodiment, the relationship between a gate-source voltage $V_{GS1}$ of the first MOSFET 1 and a gate-source voltage $V_{GS2}$ of the second MOSFET 2 is set such that the first MOSFET gate-source voltage $V_{GS1}$ is greater than the second MOSFET gate-source voltage $V_{GS2}$.

Here, note that assuming that a voltage at an inverted input terminal of the operational amplifier 4 is represented by "Vref" and the resistance value of the resistor 8 is represented by "Rs", the drain current $I_{DQ2}$ of the MOSFET 2 is represented by "Vref/Rs". The voltage Vref can be adjusted by the variable resistor 7 so that the drain current $I_{DQ2}$ is made to a prescribed value by means of the variable resistor 7. Also, assuming that the drain to source voltage of the MOSFET 2 is represented by a constant value $V_{DQ2}$ the voltage supply Vcc is represented by the following equation:

$$VCC = V_{D2} + I_{DQ2} \times Rs$$

The operational amplifier 4 controls the gate-source voltage $V_{GS2}$ of the second MOSFET 2 such that the drain current $I_{DQ2}$ of the second MOSFET 2 is always held at a prescribed value even if the MOSFET 2 is subjected to a secular change.

The operational amplifier 5 operates to match the rate of change of the gate-source voltage $V_{GS2}$ of the second MOSFET 2 with that of the gate-source voltage $V_{GS1}$ of the first MOSFET 1. Thus, assuming that the resistance values of the resistors 11, 12 are represented by "$R_{11}$", "$R_{12}$", respectively, the output voltage Vout1 of the operational amplifier 5 is represented by the following formula:

$$Vout1 = -(R_{12}/R_{11}) \times V_{GS2} \quad (1)$$

The voltage Vout1 is applied across the gate and the source of the MOSFET 1 as $V_{GS1}$. When the rate of change of the gate-source voltage $V_{GS2}$ of the second MOSFET 2 is greater than the rate of change of the gate-source voltage $V_{GS1}$ of the first MOSFET 1, the resistance $R_{11}$ of the resistor 11 is set to be greater than the resistance $R_{12}$ of the resistor 12, whereas when this relationship is reversed, the resistance $R_{11}$ is set to be less than the resistance $R_{12}$. In the operational amplifier 6, the initial value of the gate to source voltage $V_{GS2}$ of the second MOSFET 2 is set to match the initial value of the gate to source voltage $V_{GS1}$ of the first MOSFET 1. Assuming that the resistance values of the resistors 13, 14, 15 and 16 are represented by $R_{13}$, $R_{14}$, $R_{15}$ and $R_{16}$, respectively, the output voltage Vout2 of the operational amplifier 6 is represented by the following formula:

$$Vout2 = -(R_{16}/R_{15}) \times Vout1 + R_{13} \times (R_{15} + R_{16}) \times V_1/(R_{15} \times (R_{14} + R_{13}))$$

Assuming that $R_{15}$ is equal to $R_{16}$ in the right-hand side of the above formula, then $$Vout2 = -(R_{16}/R_{15}) \times Vout1 + R_{13} \times (R_{15} + R_{16}) \times \quad (2)$$
$$V_1/(R_{15} \times (R_{14} + R_{13}))$$
$$= -Vout1 + 2R_{13} \times V_1/(R_{14} + R_{13})$$

Here, $R_{13}$ and $R_{14}$ are determined such that the initial value of the gate to source voltage $V_{GS2}$ of the second MOSFET 2 matches the initial value of the gate to source voltage $V_{GS1}$ of the first MOSFET 1.

From formulae (1) and (2) above, the voltage Vout2 is expressed by the following formula (3):

$$Vout2 = (R_{12}/R_{11}) \times V_{GS2} + 2R_{13} \times V_1/(R_{14} + R_{13}) \quad (3)$$

Embodiment 2

A second embodiment of the present invention will be described in which the gate to source voltage $V_{GS1}$ of the first MOSFET 1 is less than the gate to source voltage $V_{GS2}$ of the second MOSFET 2.

Figure 3:
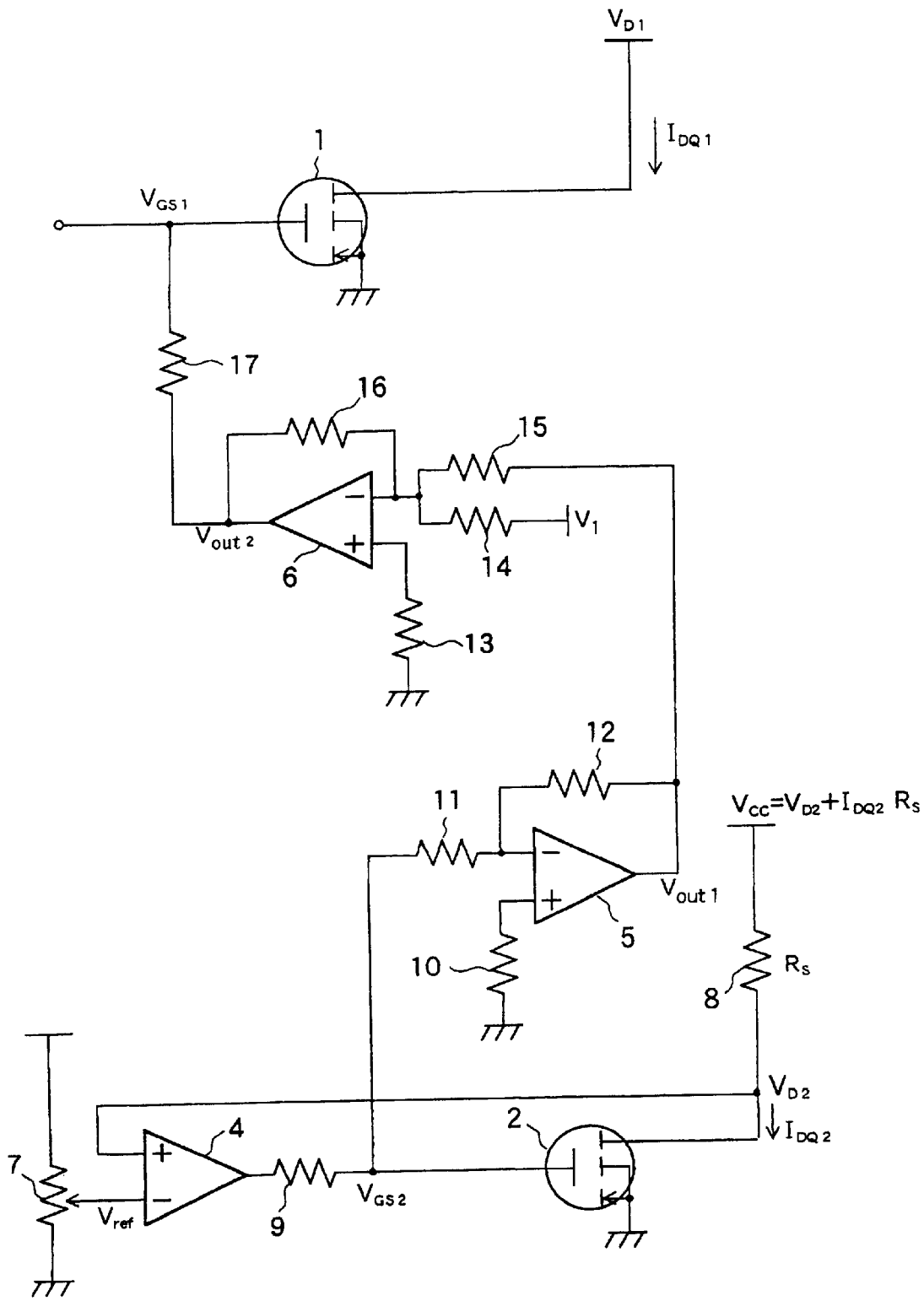
FIG. 3 is a circuit diagram showing a second embodiment of the present invention.

FIG. 3 shows a circuit diagram of the second embodiment. In FIG. 3, like symbols as in FIGS. 1 and 2 designate the like or corresponding parts or elements of the first embodiment, and hence a detailed description thereof will be omitted. Also, the operations of the second MOSFET 2 and the operational amplifiers 4, 5 of this embodiment are the same as those of FIG. 2, and thus a description thereof is omitted.

In the second embodiment, the connections of resistors connected to the input terminals of the operational amplifier 6 are different from those of the first embodiment. That is, in the first embodiment, the output terminal of the operational amplifier 5 is connected to the inverted amplification terminal of the operational amplifier 6 through the resistor 15, and the non-inverted amplification terminals of the operational amplifier 6 is connected to ground and the constant voltage terminal $V_1$ through the resistors 13, 14, respectively. On the other hand, in the second embodiment, the inverted amplification terminal of the operational amplifier 6 is connected to the output terminal of the operational amplifier 5 and the constant voltage terminal $V_1$ through the resistor 15 and the resistor 14, respectively.

Here, if the resistance $R_{15}$ of the resistor 15 is assumed to be equal to the resistance $R_{16}$ of the resistor 16, the output voltage Vout2 of the operational amplifier 6 is expressed as follows:

$$Vout2 = -R_{16} \times (Vout1/R_{15} + V_1/R_{14}) \quad (4)$$
$$= -Vout1 - R_{16} \times V_1/R_{14}$$

Here, it is to be noted that the resistances $R_{14}$, $R_{16}$ of the resistors 14, 16 are determined such that the gate to source voltage $V_{GS2}$ of the second MOSFET 2 matches the gate to source voltage $V_{GS1}$ of the first MOSFET 1. From formulae (1) and (4) above, the voltage Vout2 is obtained as follows:

$$Vout2 = R_{12} \times V_{GS2}/R_{11} - R_{16} \times V_1/R_{14} \quad (5)$$

As in FIG. 2, the voltage Vout1 is applied across the gate to source of the first MOSFET 1 as $V_{GS1}$. Where a part of a MOSFET in the chip of the first MOSFET 1 is used as the second MOSFET 2, the secular change characteristics of the first and second MOSFETs 1 and 2 become the same, so in formulae (3) and (5) above, $R_{11}$ can be made equal to $R_{12}$, and the voltage $V_1$ can be made equal to zero.

As can be seen from the above, using an inexpensive small-sized MOSFET, $I_{DQ}$ can be held constant irrespective of a secular change in the first MOSFET 1, thus suppressing a variation in the characteristics of the amplifier circuit.

As described in detail in the foregoing, a MOSFET amplifier circuit according to the present invention comprises: a first MOSFET; a constant current circuit for generating a current of a constant magnitude; a second MOSFET having the constant current generated by the constant current circuit as a drain current; and a voltage control circuit for applying a gate-source voltage of the second MOSFET to a gate-source voltage of the first MOSFET. With this arrangement, a variation in the drain current of the first MOSFET can be reduced or made constant, and by employing an inexpensive MOSFET for the second MOSFET for example, it is possible to provide the MOSFET amplifier circuit at a low cost, which is capable of compensating for the drain current to a constant value.

The second MOSFET in the MOSFET amplifier circuit may preferably be formed in a chip into which the first MOSFET is built, whereby the secular change characteristics of the first and second MOSFETs are made substantially the same, thus rendering the circuit design easy and simple.

While the invention has been described in terms of a few preferred embodiments, those skilled in the art will recognize that the invention can be practiced with modification within the spirit and scope of the appended claims.

What is claimed is:

1. A metal-oxide semiconductor field-effect transistor (MOSFET) amplifier circuit comprising:
   a first MOSFET;
   a constant current circuit for generating a current of a constant magnitude;
   a second MOSFET having a constant drain current controlled by said constant current circuit; and
   a voltage control circuit connected to receive a gate-source voltage of said second MOSFET for supplying it to said first MOSFET as a gate-source voltage thereof,
   wherein said voltage control circuit has a voltage amplification factor comprising a difference in magnitude between a change in said gate-source voltage of said first MOSFET and a change in said gate-source voltage of said second MOSFET.

2. The MOSFET amplifier circuit according to claim 1, wherein said second MOSFET comprises a MOSFET element formed in a chip into which said first MOSFET is built.

3. The MOSFET amplifier circuit according to claim 1, wherein said voltage control circuit includes an operational amplifier for amplifying said supplied gate-source voltage.

4. The MOSFET amplifier circuit according to claim 1, wherein said voltage control circuit comprises a plurality of operational amplifiers, each operational amplifier of said plurality having a resistor coupled thereto.

5. The MOSFET amplifier circuit according to claim 1, wherein said constant current circuit comprises an operational amplifier, a variable resistor connected to an inverted input terminal of said operational amplifier for adjusting a voltage at said inverted input terminal, a power supply connected to a non-inverted input terminal of said operational amplifier, and a resistor connected between said power supply and said non-inverted terminal.

6. The MOSFET amplifier circuit according to claim 1, wherein an initial value and a rate of change of said gate-source voltage of said second MOSFET is adjusted so that said drain current of said first MOSFET is substantially constant.

7. The MOSFET amplifier circuit according to claim 1, wherein said gate-source voltage of said first MOSFET is greater than said gate-source voltage of said second MOSFET.

8. The MOSFET amplifier circuit according to claim 1, wherein said gate-source voltage of said first MOSFET is less than said gate-source voltage of said second MOSFET.

9. The MOSFET amplifier circuit according to claim 1, further comprising:
   an operational amplifier for setting a rate of change of said gate-source voltage of said second MOSFET to match a rate of change of said gate-source voltage of said first MOSFET.

10. The MOSFET amplifier circuit according to claim 1, further comprising:
    an operational amplifier for setting an initial value of said gate-source voltage of said second MOSFET to match an initial value of said gate-source voltage of said first MOSFET.

* * * * *